(12) United States Patent
Hsieh

(10) Patent No.: US 6,573,142 B1
(45) Date of Patent: Jun. 3, 2003

(54) METHOD TO FABRICATE SELF-ALIGNED SOURCE AND DRAIN IN SPLIT GATE FLASH

(75) Inventor: Chia-Ta Hsieh, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/083,992

(22) Filed: Feb. 26, 2002

(51) Int. Cl.⁷ .................................................. H01L 21/8247

(52) U.S. Cl. .................................................. 438/266

(58) Field of Search .................... 438/257–267

(56) References Cited

U.S. PATENT DOCUMENTS

| | | | | |
|---|---|---|---|---|
| 6,117,733 | A | 9/2000 | Sung et al. | 438/265 |
| 6,204,126 | B1 | 3/2001 | Hsieh et al. | 438/267 |
| 6,207,503 | B1 | 3/2001 | Hsieh et al. | 438/263 |
| 6,228,695 | B1 | 5/2001 | Hsieh et al. | 438/201 |
| 6,235,581 | B1 * | 5/2001 | Chen | 438/257 |
| 2002/0055228 | A1 * | 5/2002 | Ambrose et al. | 438/257 |

* cited by examiner

*Primary Examiner*—Richard Booth
(74) *Attorney, Agent, or Firm*—George O. Saile; Stephen B. Ackerman

(57) ABSTRACT

A new structure is disclosed for source/drain bit lines in arrays of MOSFET devices. Rows of conducting regions are formed by ion implantation through openings adjacent to gate structures and in isolation regions separating columns of active areas of the arrays. The openings are filled with insulating material.

24 Claims, 8 Drawing Sheets

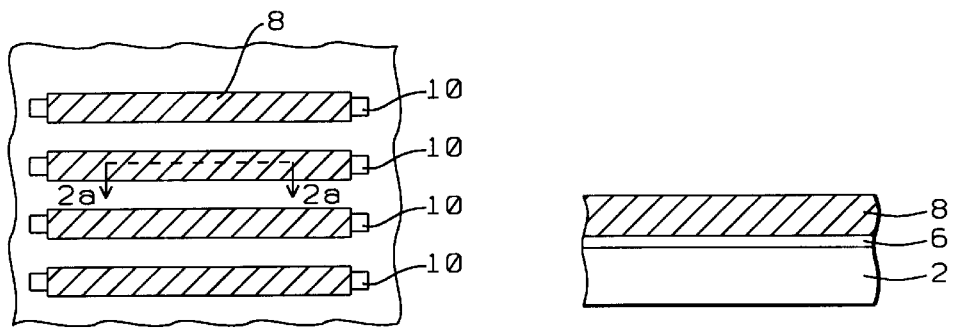
FIG. 1a – Prior Art
FIG. 2a – Prior Art
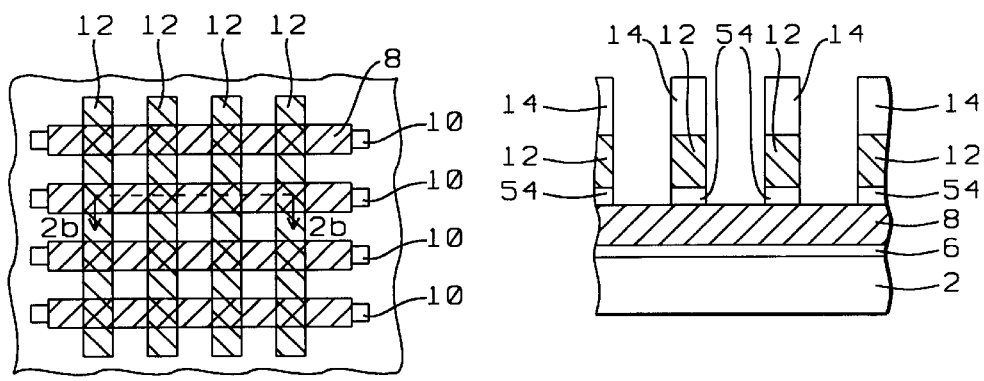
FIG. 1b – Prior Art
FIG. 2b – Prior Art

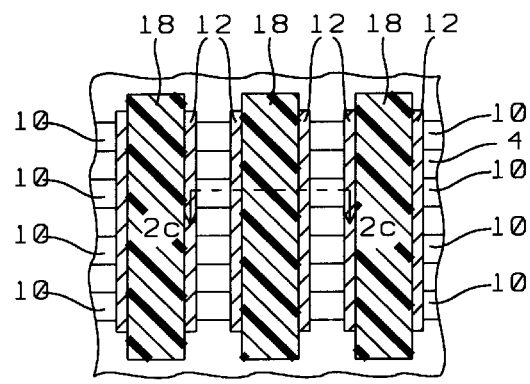
FIG. 1c - Prior Art
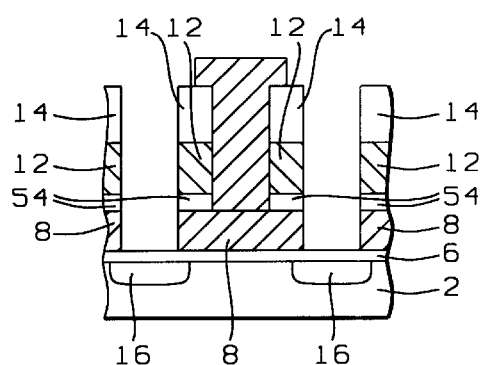
FIG. 2c - Prior Art
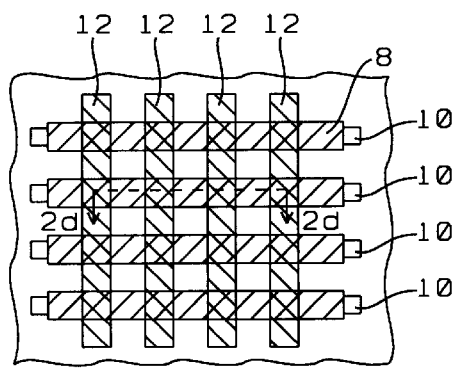
FIG. 1d - Prior Art
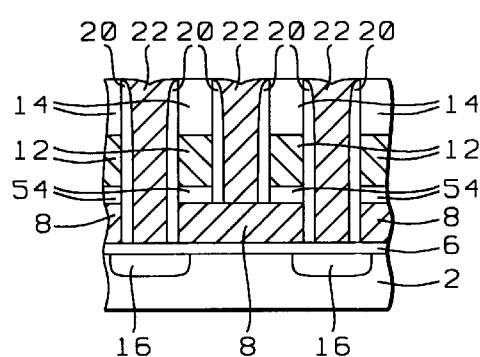
FIG. 2d - Prior Art

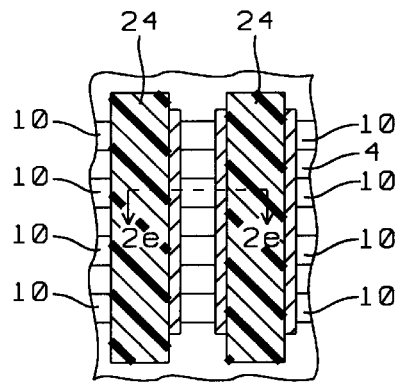
FIG. 1e –
Prior Art
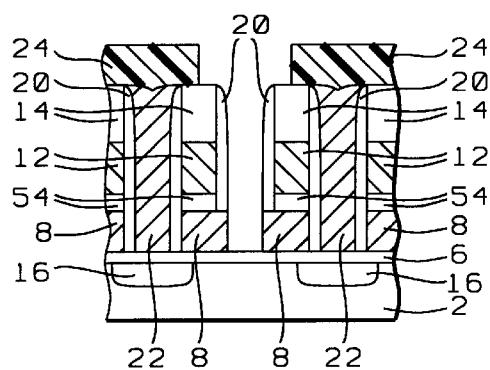
FIG. 2e –
Prior Art
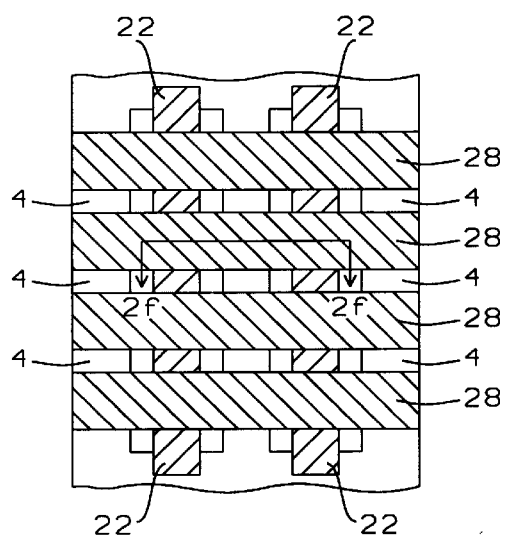
FIG. 1f –
Prior Art
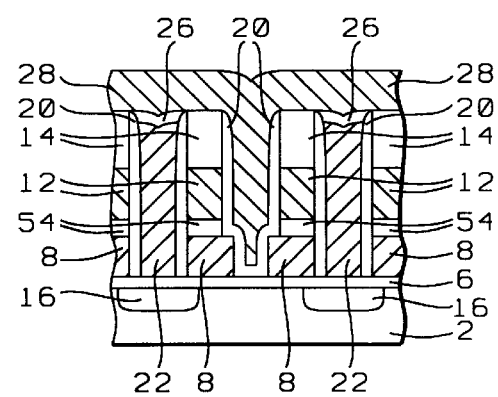
FIG. 2f –
Prior Art

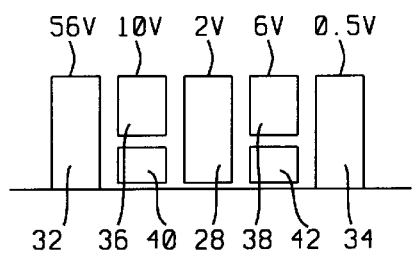
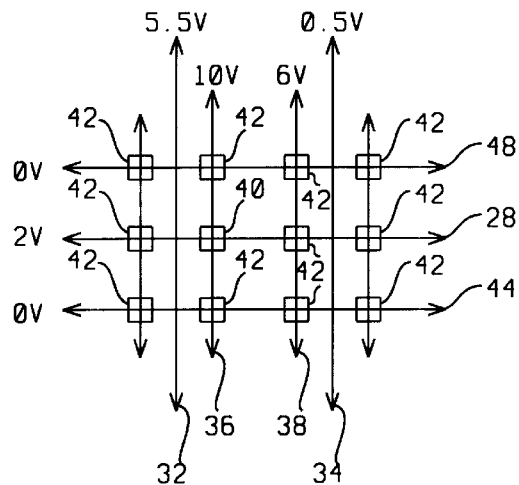
FIG. 3a – Prior Art
FIG. 3b – Prior Art
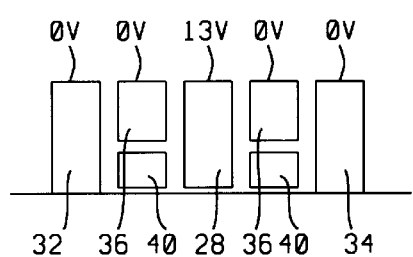
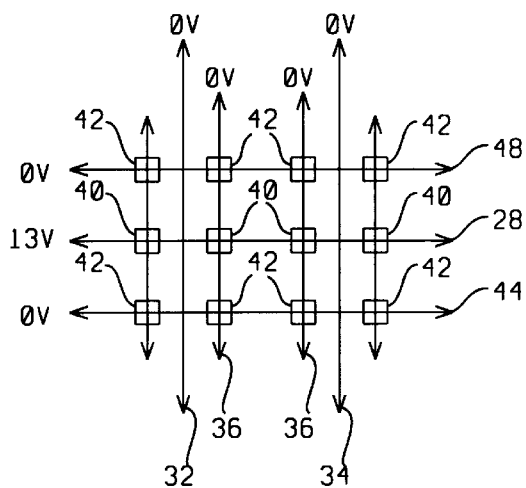
FIG. 4a – Prior Art
FIG. 4b – Prior Art

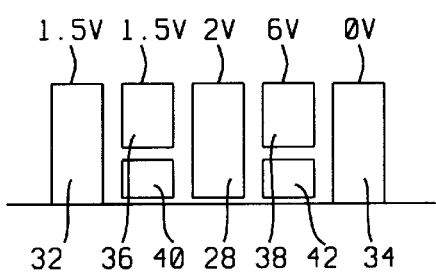
FIG. 5a – Prior Art
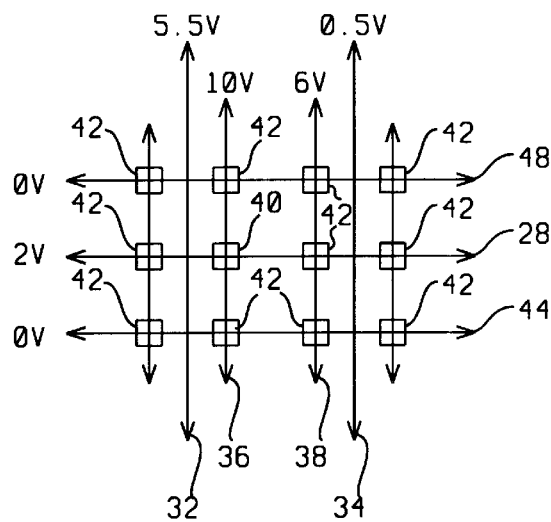
FIG. 5b – Prior Art
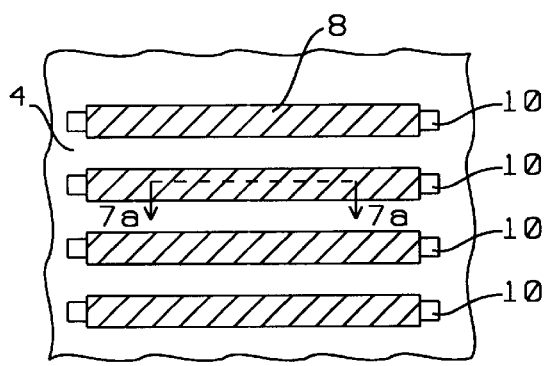
FIG. 6a
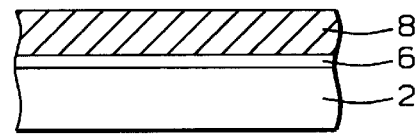
FIG. 7a

METHOD TO FABRICATE SELF-ALIGNED SOURCE AND DRAIN IN SPLIT GATE FLASH

BACKGROUND OF THE INVENTION (1) Field of the Invention

The present invention relates generally to semiconductor integrated circuit technology and more particularly to split gate memory cells used in flash EPROMs (Electrically Erasable Programmable Read Only Memory).

(2) Description of Prior Art

Increased performance in computers is often directly related to a higher level of circuit integration. Tolerances play an important role in the ability to shrink dimensions on a chip. Self-alignment of components in a device serves to reduce tolerances and thus improve the packing density of chips. Other techniques can be important in shrinking device size. A method is disclosed later in the embodiments of the present invention of forming self-aligned source and drain regions through which a significant reduction in the split-gate flash memory cell area is possible. As is well known in the art, a split-gate flash memory cell normally has source and drain regions that are contacted by utilizing poly plugs. Insulating layers are required as spacers to separate these poly plugs from the floating gates and control gates of the cell, and this uses up area. Furthermore, because of the high voltages required in the erase operation the spacer width cannot be decreased without paying a penalty in reduced reliability. Elimination of the poly plugs, as in the method disclosed by the present invention, eliminates the reliability issue, allows a reduction in cell area and facilitates shrinking the cell size.

A method of fabricating a traditional split gate flash memory cell is presented in FIGS. 1a–1f, where top views of the cell are presented at successive stages of the process and in FIGS. 2a–2f, which show the corresponding cross-sections. Active regions, 10, are defined on a semiconductor substrate, 2, which preferably is a silicon substrate, using isolating regions, such as shallow trench isolation regions, 4. An implant is performed to adjust the cell threshold voltage, which may be a boron implant at about 20 keV to a dose of about 5E11 per sq. cm. The floating gate oxide, 6, is then formed to a thickness of about 150 Angstroms, followed by deposition of a poly 1 layer, 8, to a depth of about 800 Angstroms. A photoresist layer is formed and patterned to partially define the poly 1 floating gates, and after a poly 1 etch, to achieve the shape of region 8 as shown in FIG. 1a, and removal of the photoresist, the structure is as depicted in FIGS. 1a and 2a. The traditional method continues with formation of a dielectric separator between the poly 1 floating gate and poly 2 control gate that is disposed over the dielectric separator. This dielectric separator often consists of composite oxide/nitride/oxide (ONO) layers, with the layer thickness being about 75, 150, 30 Angstroms, respectively. There follows a deposition of about 1000 Angstroms of poly 2 and then about 1500 Angstroms of nitride 1. A photoresist layer is formed and patterned to define the control gates. Etching the nitride layer, the poly 2 layer and the ONO layer and then removing the photoresist results in the structure depicted in FIGS. 1b and 2b. The ONO layer, 54, provides dielectric separation between the poly 2 layer, 12, which acts as a control gate or transfer gate, and the poly 1 floating gate. The nitride 1 layer, 14, is required for dielectric separation between poly 2 and subsequent poly layers. A photoresist layer is formed and patterned, 18, to define source/drain openings, poly 1 is etched and source/drain implantation performed to create source/drain regions 16. Often arsenic ions are used for the source/drain implantation, at energy of about 50 keV to a dose of about 3E15 per sq. cm. After removal of the photoresist, 18, about 500 Angstrom of high temperature oxide (HTO) is formed and etched to create HTO spacers, 20. Next, about 1500 Angstroms of poly 3 is deposited and etched back to form poly plugs, 22, to contact the source drain regions, 16. The structure is at this stage as depicted in FIGS. 1d and 2d. Spacers 20 serve to isolate poly plugs, 22, from poly 1 regions, 8, and poly 2 regions, 12. For this isolation to be reliable the spacers must be sufficiently wide, posing a restriction on shrinkage of the cell. A photoresist layer is formed and patterned, 24, to define the erasing gate regions. Poly 3 and poly 1 of the exposed regions are etched. The structure of the floating gates 30 is now complete. An implant, often BF2 at about 60 keV to a dose of about 1E13 per sq. cm., is performed to adjust the erasing gate threshold voltage and the exposed floating gate oxide, 6, is etched. At this point the structure is as depicted in FIGS. 1e and 2e. Following photoresist removal, about 250 Angstroms of erasing gate oxide, 26, is formed. Next the erasing gate, 28, is formed. This is accomplished by depositing about 1500 Angstroms of poly 4, forming and defining a photoresist layer for the erasing gate, etching the poly 4 and removing the photoresist. This completes the formation of a traditional split gate flash memory cell, which is shown in FIGS. 1f and 2f.

There are three basic operations used in a split gate flash memory cell. These are the program operation, the erase operation and the read operation, which are shown in FIGS. 3a and 3b, FIGS. 4a and 4b, and FIGS. 5a and 5b, respectively. In the programming operation electrons are injected into a particular floating gate or bit, and the selection of the bit involves an erasing gate line acting as a word line and a drain line acting as a bit line. The programming process, the process of charging the floating gates, is shown in FIG. 3a. Voltages applied to control gate, 36, erasing gate, 28, and transfer gate, 36, form an n-channel. The voltage applied to the drain, 32, is sufficiently higher than that applied to the source, 34, so that channel electrons in the vicinity of the selected floating gate, 40, have been heated significantly. A higher voltage applied to the control gate, 36, causes an enhanced injection of the heated electrons into the floating gate, 40, which charges the floating gate. Selection of the programmed bit is illustrated in FIG. 3b. Successive erasing gate or word lines, 44, 28 and 46 have 0, 2 and 0 volts applied respectively. Only with cell 40 are the two necessary conditions for programming satisfied. It is along word line 28 with 2 volts applied, so a continuous channel is established between source and drain so that channel electrons can be heated by the source-drain potential difference. In addition, there is a higher voltage applied to its control gate to enhance injection of the heated channel electrons. Thus only bit 40 will be programmed. Other cells, 42, are not selected because either channel electrons are not heated, or there is no higher voltage applied to a control gate to facilitate electron injection into the corresponding floating gate or both conditions are absent. In the erase operation, shown in FIGS. 4a and 4b, a high voltage, sufficient to cause Fowler-Nordheim (F-N) tunneling through the poly-to-poly oxide between adjacent erasing and floating gates, is applied to an erasing gate word line, 28. All other voltages are maintained at 0 volts so that all floating gates along the biased word line, 40 in FIG. 4b, are selected, while cells 42, along unbiased word lines, such as 44 and 48, are not selected. The high erasing gate voltage required, achieving sufficient F-N tunneling, could present reliability issues due to high oxide stress. The read operation, in which the bit to be read is selected by a word line and a bit line, is shown in FIGS. 5a and 5b and determines if the selected bit is in the programmed state or in the erased state. With the source, 34, at 0 volts, 1.5 volts are applied to the drain line, 32, acting as the bit line, of the selected cell, 40, and 2 volts are applied to the erasing gate line, 28, acting as the word line of the selected cell, 40. There is 6 volts applied to transfer gates, 38 and 1.5 volts to control gates, 36. When the selected cell is in the programmed state a channel does not form under the selected cell and the drain current is low. On the other hand, when the selected cell is in the erased state a channel does form under the selected cell and there is thus a complete channel from source to drain and a large drain current is observed.

A method of forming polysilicon gate tips for enhanced F-N tunneling in split-gate flash memory cells is disclosed in U.S. Pat. No. 6,117,733 to Sung et al. A method for shrinking array dimensions of split-gate memory devices, using multilayer etching to define cell and source lines, is disclosed in U.S. Pat. No. 6,207,503 to Hsieh et al. In U.S. Pat. No. 6,204,126 to Hsieh et al. there is disclosed a split-gate flash memory cell where the floating gate of the cell is self aligned to isolation to source and to word line. In U.S. Pat. No. 6,228,695 to Hsieh et al. there is disclosed a split-gate flash memory cell where the floating gate of the cell is self aligned to the control gate and the source is self aligned.

SUMMARY OF THE INVENTION

It is a primary objective of the invention to provide a method of forming self-aligned source and drain regions through which a significant reduction in the split-gate flash memory cell area is possible. As is well known in the art, a split-gate flash memory cell normally has source and drain regions that are contacted by utilizing poly plugs. Insulating layers are required as spacers to separate these poly plugs from the floating gates and control gates of the cell, and this uses up area. Furthermore, because of the high voltages required in the erase operation the spacer width cannot be decreased without paying a penalty in reduced reliability. Elimination of the poly plugs, as in the method disclosed by the present invention, eliminates the reliability issue, allows a reduction in cell area and facilitates shrinking the cell size. Instead of poly plugs, a new self-aligned source/drain oxide etching procedure enables the formation of source/drain regions that are connected in rows directly within the silicon. This procedure of connecting source/drains is generally applicable to arrays of MOSFET-like devices.

A new structure is disclosed for source/drain bit lines in arrays of MOSFET devices. Rows of conducting regions are formed by ion implantation through openings adjacent to gate structures and in isolation regions separating columns of active areas of the arrays. The openings are filled with insulating material.

BRIEF DESCRIPTION OF THE DRAWINGS

In the accompanying drawing forming a material part of this description, there is shown:

FIGS. 1a–1f show top views depicting a traditional method of forming split gate flash memory cells.

FIGS. 2a–2f show cross sectional views depicting a traditional method of forming split gate flash memory cells.

FIGS. 3a and 3b show the program operation.

FIGS. 4a and 4b show the erase operation.

FIGS. 5a and 5b show the read operation.

FIGS. 6a–6f show top views depicting a method of forming split gate flash memory cells according to the invention.

FIGS. 7a–7f show cross sectional views depicting a method of forming split gate flash memory cells according to the invention.

DESCRIPTION OF THE PREFERRED EMBODIMENTS

Figure 7B:
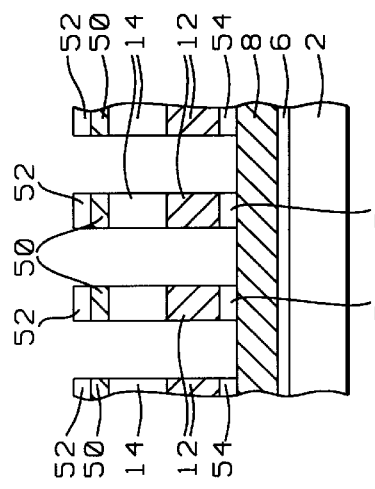
Figure 7C:
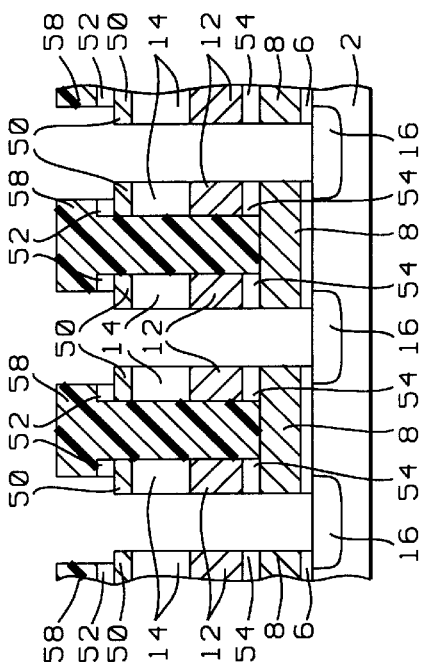
Figure 6B:
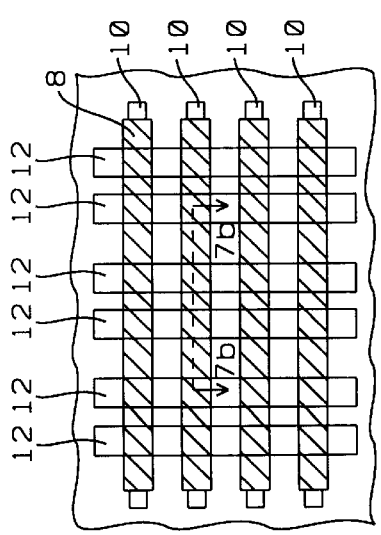
Figure 6C:
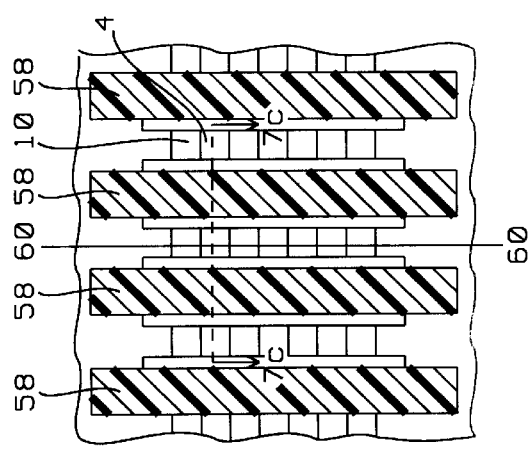
Figure 7D:
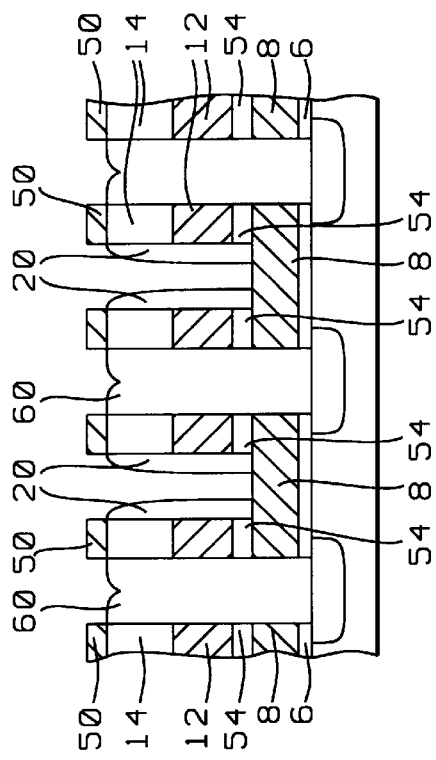
Figure 7E:
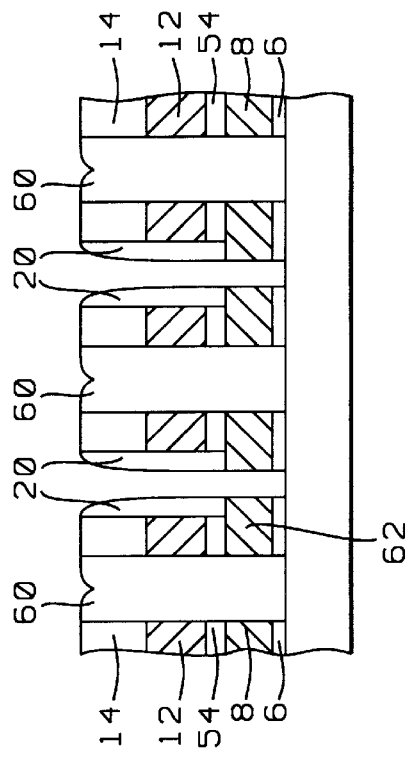
Figure 6D:
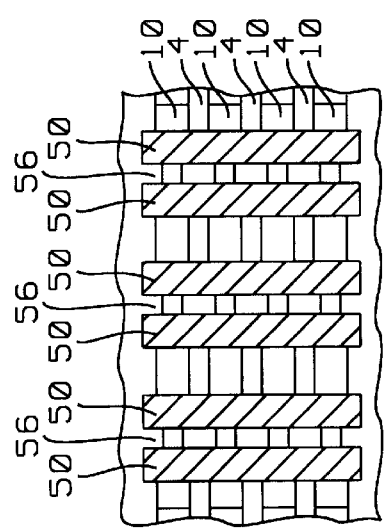
Figure 6E:
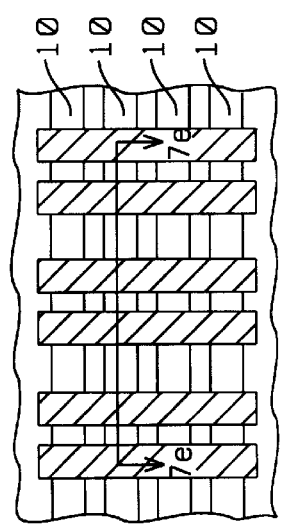
Figure 7F:
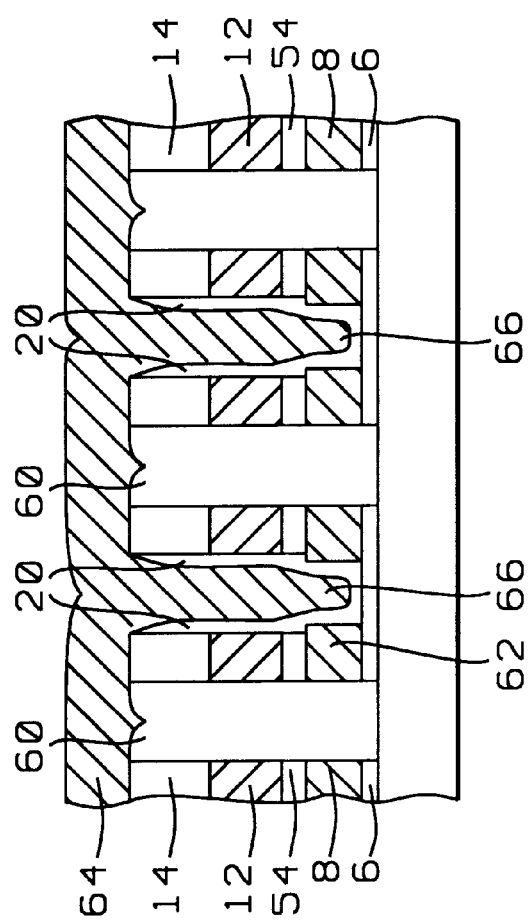
Figure 6F:
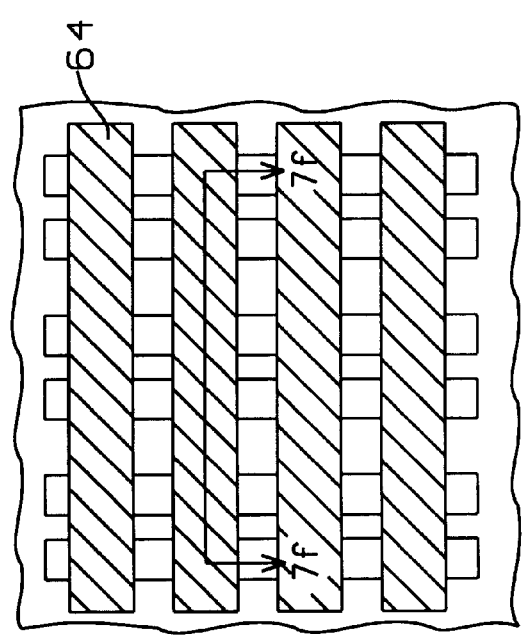

Preferred embodiments of the invention are well described with the aid of FIGS. 6a–6f and 7a–7f. A method of fabricating a novel split gate flash memory cell is presented in FIGS. 6a–6f, where top views of the cell are presented at successive stages of the process and in FIGS. 7a–7f, which show the corresponding cross-sections. Active regions, 10, are defined on a p-type semiconductor substrate, 2, which preferably is a silicon substrate, using oxide filled isolation regions, such as shallow trench isolation, STI, regions, 4. An implant is performed to adjust the cell threshold voltage, which may be a boron implant at about 20 keV to a dose of about 5E11 per sq. cm. The floating gate oxide, 6, is then formed to a thickness of about 150 Angstroms, followed by deposition of a conductive layer, which preferably is a poly 1 layer, 8, to a depth of about 800 Angstroms. A photoresist layer is formed and patterned to partially define the poly 1 floating gates. After a poly 1 etch, to achieve the shape of region 8 as shown in FIG. 6a, and removal of the photoresist, the structure is as depicted in FIGS. 6a and 7a. As in the traditional method, the method of the invention continues with formation of a dielectric separator between the poly 1 floating gate and poly 2 control gate that is disposed over the dielectric separator. This dielectric separator often consists of composite oxide/ nitride/oxide (ONO) layers, with the layer thickness being about 75, 150, 30 Angstroms, respectively. There follows a deposition of a conductive layer, which preferably is about 1000 Angstroms of poly 2 and then deposition of about 1500 Angstroms of nitride 1, which is preferably a silicon nitride layer. Two layers are now applied that are required for the self-aligned source/drain etching approach of the invention. A deposition of about 500 Angstroms of a conductive layer, which is preferably a poly 3 layer, 50, is followed by deposition of about 250 Angstroms of TEOS, 52, these layers serving as etch stop layers. A photoresist layer is formed and patterned to define the control gates. Since in the self-aligned source/drain etching approach poly plugs are not needed to contact the source/drain regions, the source/ drain openings 56 can be made much thinner than in the traditional method. With no poly plugs in the source/drain openings there is no need of insulating spacers to isolate the poly plugs from poly 1 and poly 2 regions, regions that could have sizable voltage applied. The only limitation is the required thickness of the source drain regions. Thus, by eliminating the insulating spacers, substantial cell shrinkage is achieved. Etching the TEOS layer, the poly 3 layer, the nitride layer, the poly 2 layer and the ONO layer and then removing the photoresist, results in the structure depicted in FIGS. 6b and 7b. The ONO layer, 54, provides dielectric separation between the poly 2 layer, 12, which acts as a control gate or transfer gate, and the poly 1 floating gate. The nitride 1 layer, 14, is required for dielectric separation between poly 2 and subsequent poly layers. A photoresist layer is formed and patterned, 58, to define source/drain openings, poly 1 is etched with the TAOS layer serving as an etching stop layer. The self-aligned source/drain oxide etch step is now performed, removing the floating gate oxide layers under poly 1 openings formed below the source/drain openings 56 and also from STI regions along rows 60—60. Thus, the silicon surface is exposed continuously along rows 60—60. Source/drain implantation is now performed, and in addition to creating source/drain regions 16, the implantation also creates conducting regions, below the etched STI regions, that serve to electrically connect source/drain regions of a row. Common source/drain lines are thus formed, which are utilized as bit lines. Often arsenic ions are used for the source/drain implantation, at energy of about 50 keV to a dose of about 3E15 per sq. cm. After removal of the photoresist, 58, a layer of high temperature oxide (HTO) is formed. The thickness of the HTO layer should be sufficient to fill the source/drain openings with oxide, 60 and also so that the sidewall spacers 20, created after etching the HTO layer, are appropriately thick. A sidewall spacer is appropriately thick if, with voltage applied for an erase operation, the sidewall spacer is thin enough so that sufficient F-N current flows through the spacer between the floating gate and erase gate, yet thick enough to avoid reliability concerns. The structure is at this stage as depicted in FIGS. 6d and 7d. Next a poly 1 etch completes the definition of the floating gates 62 and creates an opening for the erasing gates. At the sane time the poly 3 layers are removed. An erasing gate threshold voltage implant is performed, which commonly uses BF2 with an energy of about 60 keV to a dose of about 1E13 per sq. cm. , adjust the erasing gate threshold voltage and then the exposed floating gate oxide, 6, is etched. At this point the structure is as depicted in FIGS. 6e and 7e. About 250 Angstroms of erasing gate oxide, 66, is formed after which the erasing gate, 64, is formed. This is accomplished by depositing about 1500 Angstroms of poly 4, forming and defining a photoresist layer for the erasing gate, etching the poly 4 and removing the photoresist. This completes the formation of a 1 split gate flash memory cell according to the invention, which is shown in FIGS. 6f and 7f.

The three basic operations used in a split gate flash memory according to the invention are exactly those used in conventional split gate flash memories. These are the program operation, the erase operation and the read operation, which are shown in FIGS. 3a and 3b, FIGS. 4a and 4b, and FIGS. 5a and 5b, respectively. In the programming operation electrons are injected into a particular floating gate or bit, and the selection of the bit involves an erasing gate line acting as a word line and a drain line acting as a bit line. The programming process, the process of charging the floating gates, is shown in FIG. 3a. Voltages applied to control gate, 36, erasing gate, 28, and transfer gate, 36, form an n-channel. The voltage applied to the drain, 32, is sufficiently higher than that applied to the source, 34, so that channel electrons in the vicinity of the selected floating gate, 40, have been heated significantly. A higher voltage applied to the control gate, 36, causes an enhanced injection of the heated electrons into the floating gate, 40, which charges the floating gate. Selection of the programmed bit is illustrated in FIG. 3b. Successive erasing gate or word lines, 44, 28 and 46 have 0, 2 and 0 volts applied respectively. Only with cell 40 are the two necessary conditions for programming satisfied. It is along word line 28 with 2 volts applied, so a continuous channel is established between source and drain so that channel electrons can be heated by the source-drain potential difference. In addition, there is a higher voltage applied to its control gate to enhance injection of the heated channel electrons. Thus only bit 40 will be programmed.

Other cells, 42, are not selected because either channel electrons are not heated, or there is no higher voltage applied to a control gate to facilitate electron injection into the corresponding floating gate or both conditions are absent. In the erase operation, shown in FIGS. 4a and 4b, a high voltage, sufficient to cause Fowler-Nordheim (F-N) tunneling through the poly-to-poly oxide between adjacent erasing and floating gates, is applied to an erasing gate word line, 28. All other voltages are maintained at 0 volts so that all floating gates along the biased word line, 40 in FIG. 4b, are selected, while cells 42, along unbiased word lines, such as 44 and 48, are not selected. The high erasing gate voltage required, achieving sufficient F-N tunneling, could present reliability issues due to high oxide stress. The read operation, in which the bit to be read is selected by a word line and a bit line, is shown in FIGS. 5a and 5b and determines if the selected bit is in the programmed state or in the erased state. With the source, 34, at 0 volts, 1.5 volts are applied to the drain line, 32, acting as the bit line, of the selected cell, 40, and 2 volts are applied to the erasing gate line, 28, acting as the word line of the selected cell, 40. There is 6 volts applied to transfer gates, 38 and 1.5 volts to control gates, 36. When the selected cell is in the programmed state a channel does not form under the selected cell and the drain current is low. On the other hand, when the selected cell is in the erased state a channel does form under the selected cell and there is thus a complete channel from source to drain and a large drain current is therefor observed. Processes to form the layers of embodiments of the invention, to etch or remove them and to perform the ion implantation steps are well known in detail by practitioners of the art.

Other preferred embodiments of the invention could involve arrays of MOSFET devices other than split gate flash memory cells. The objective is to fabricate rows of electrically connected self-aligned source/drain regions. In the method of the invention this is accomplished after the layers comprising gate structures adjacent to source/drains are formed. These layers are etched to the silicon substrate to form openings that are aligned in rows at source/drain positions. At the same time opening are etched through to the silicon surface of adjoining isolation regions aligned along the same rows as the source/drain openings. Thus source/drain openings and isolation region openings form continuous rows. Performing source/drain ion implantation into the silicon under these openings creates continuous conductive regions forming rows through the silicon substrate under these openings. Conductive regions under the source/drain openings act as source/drain regions and these are connected in rows by the conductive regions created under the isolation region openings. The openings can be filled with oxide, preferably high temperature oxide. Embodiments of the invention pertain to arrays of n-channel and arrays of p-channel MOSFET devices. For arrays of n-channel devices n-type conductive regions are formed by ion implantation, by implanting arsenic ions, for example. For arrays of p-channel devices p-type conductive regions are formed by ion implantation, by implanting boron ions, for example.

While the invention has been particularly shown and described with reference to the preferred embodiments thereof, it will be understood by those skilled in the art that various changes in form and detail may be made without departing from the spirit and scope of the invention.

What is claimed is:

1. A method of fabricating a new structure for source/drain bit lines in arrays of MOSFET devices comprising:

providing a partially processed array of MOSFET devices having active areas arranged in columns which are surrounded by insulator filled isolation regions and having formed, but not patterned, all layers comprising gate structures that are adjacent to source/drain regions, etching, in rows, all layers comprising gate structures that are adjacent to source/drain regions and insulator filled isolation regions to form openings that are aligned in rows passing source/drain positions;

performing ion implantation into the silicon under said openings creating continuous conductive regions forming rows through the silicon substrate under said openings; and filling said openings with insulating material.

2. The method of claim 1 wherein said MOSFET devices are n-channel devices and said conducting regions are formed to be n-type.

3. The method of claim 1 wherein said MOSFET devices are p-channel devices and said conducting regions are formed to be p-type.

4. The method of claim 1 wherein said insulating material is an oxide.

5. The method of claim 1 wherein said insulating material is a high temperature oxide.

6. A method to fabricate self-aligned source/drain lines in split gate flash memory arrays, comprising:

providing an extensive p-type semiconductor region on a semiconductor substrate;

defining columns of active regions by surrounding said active regions with oxide filled isolation regions;

performing a first threshold voltage adjust implant;

forming a floating gate oxide layer over the surface of said active regions;

forming a poly 1 layer;

forming a photoresist layer and patterning said photoresist layer to etch said poly 1 layer so that after etching said poly 1 layer is disposed over said active regions;

performing a poly 1 layer etch;

removing the photoresist layer;

forming sequentially, a first insulating layer, a poly 2 layer, a second insulating layer, a poly 3 layer and a first oxide layer;

forming another photoresist layer and patterning the photoresist to form, upon etching, two kinds of interposed openings in a direction perpendicular to the active region; openings for source/drain lines that could be narrower than openings for erase gates;

etching sequentially, said first oxide layer, said poly 3 layer, said second insulating layer, said poly 2 layer and said first insulating layer;

removing said other photoresist layer;

forming a third photoresist layer and patterning the photoresist so as to deepen, upon etching, only the openings for source/drain lines;

etching said poly 1 layer;

etching floating gate oxide and oxide of said isolation regions;

performing a source/drain ion implantation;

removing the third photoresist layer;

forming a second oxide layer and etching said second oxide layer so that the source/drain openings are filled with said second oxide and so that sidewall spacers, composed of said second oxide, remain;

etching exposed poly 1 layer and poly 3 layer;

performing a second threshold adjust implant for the erase gates;

etching exposed floating gate oxide;

forming an erasing gate oxide layer;

forming a poly 4 layer;

forming a fourth photoresist layer and patterning the photoresist for erase gate lines disposed over the active regions;

etching said poly 4 layer;

removing the fourth photoresist layer.

7. The method of claim 6 wherein said p-type semiconductor region is a p-substrate.

8. The method of claim 6 wherein said p-type semiconductor region is a p-well.

9. The method of claim 6 wherein said isolation regions are shallow trench isolation regions.

10. The method of claim 6 wherein said first threshold voltage adjust implant is performed using Boron ions at energy of about 20 keV and a dose of about 5E11 per sq. cm.

11. The method of claim 6 wherein said floating gate oxide is formed to a thickness of about 150 Angstroms.

12. The method of claim 6 wherein said poly 1 layer is formed to a thickness of about 800 Angstroms.

13. The method of claim 6 wherein said first insulating layer is an ONO layer in which the bottom oxide layer is about 75 Angstroms thick, the silicon nitride layer is about 150 Angstroms thick and the top oxide layer is about 30 Angstroms thick.

14. The method of claim 6 wherein said poly 2 layer is formed to a thickness of about 1000 Angstroms.

15. The method of claim 6 wherein said second insulating layer is a silicon nitride layer that is about 1500 Angstroms thick.

16. The method of claim 6 wherein said poly 3 layer is formed to a thickness of about 500 Angstroms.

17. The method of claim 6 wherein said first oxide layer is a TEOS layer formed to a thickness of about 250 Angstroms.

18. The method of claim 6 wherein said source/drain openings are about 500 to about 2000 Angstroms wide.

19. The method of claim 6 wherein said erase gate openings are about 500 to about 2000 Angstroms wide.

20. The method of claim 6 wherein said source/drain ion implantation is performed using Arsenic ions at energy of about 50 keV and a dose of about 3E15 per sq. cm.

21. The method of claim 6 wherein said second oxide layer is an HTO layer formed to a thickness of about 500 Angstroms.

22. The method of claim 6 wherein said second threshold voltage adjust implant is performed using BF2 ions at energy of about 60 keV and a dose of about 1E13 per sq. cm.

23. The method of claim 6 wherein said erase gate oxide is formed to a thickness of about 250 Angstroms.

24. The method of claim 6 wherein said poly 4 layer is formed to a thickness of about 1500 Angstroms.

* * * * *